United States Patent [19]
Maxwell

[11] Patent Number: 5,671,150
[45] Date of Patent: Sep. 23, 1997

[54] SYSTEM AND METHOD FOR MODELLING INTEGRATED CIRCUIT BRIDGING FAULTS

[75] Inventor: Peter C. Maxwell, Sunnyvale, Calif.

[73] Assignee: Hewlett-Packard Company, Palo Alto, Calif.

[21] Appl. No.: 322,649

[22] Filed: Oct. 13, 1994

[51] Int. Cl.⁶ .................................................. G06F 17/50
[52] U.S. Cl. ........................ 364/488; 364/489; 364/578
[58] Field of Search ................................ 364/488, 489, 364/578

[56] References Cited

U.S. PATENT DOCUMENTS

| | | | |
|---|---|---|---|
| 4,233,682 | 11/1980 | Liebergot et al. | 371/68 |
| 4,817,012 | 3/1989 | Cali | 364/488 |
| 4,872,126 | 10/1989 | Premerlani et al. | 364/578 |
| 4,907,180 | 3/1990 | Smith | 364/578 |
| 5,051,911 | 9/1991 | Kimura et al. | 364/468 |
| 5,345,401 | 9/1994 | Tani | 364/578 |

OTHER PUBLICATIONS

Renovell et al., "A Unified Model for Inter–Gate and Intra–Gate CMOS Bridging Fault: The Configuration Ration," IEEE, 1994, pp. 170–175.

Chess et al., "On Evaluating Competing Bridge Fault Models for CMOS ICS", IEEE, 1994, pp. 446–451.

Millman et al., "Special Application of The Voting Model for Bridging Faults," IEEE, 1994, pp. 263–270.

Primary Examiner—Kevin J. Teska
Assistant Examiner—Thai Phan
Attorney, Agent, or Firm—Pehr Jansson

[57] ABSTRACT

A system and method for simulating bridging faults uses means for retrieving, as a function of voltage, strengths of simple transistor circuits relative to the strength of a reference device. This relative strength is used to determine the voltage at bridge faults. The bridge voltage is compared to the threshold voltages of devices connected to the bridging node to determine the logic interpretation by such gates of such voltage. Other systems and methods are disclosed.

7 Claims, 13 Drawing Sheets

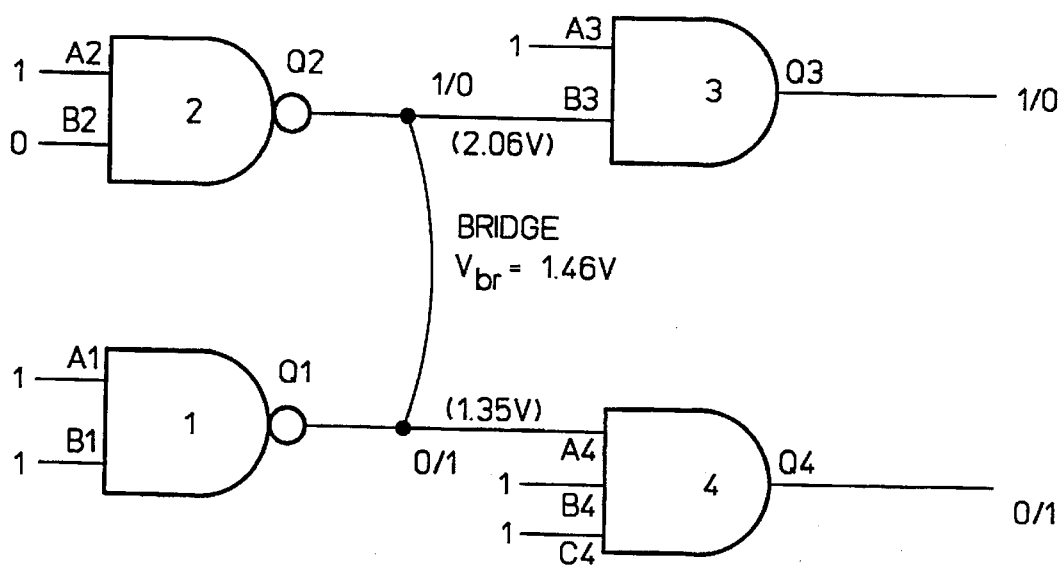
FIG. 4
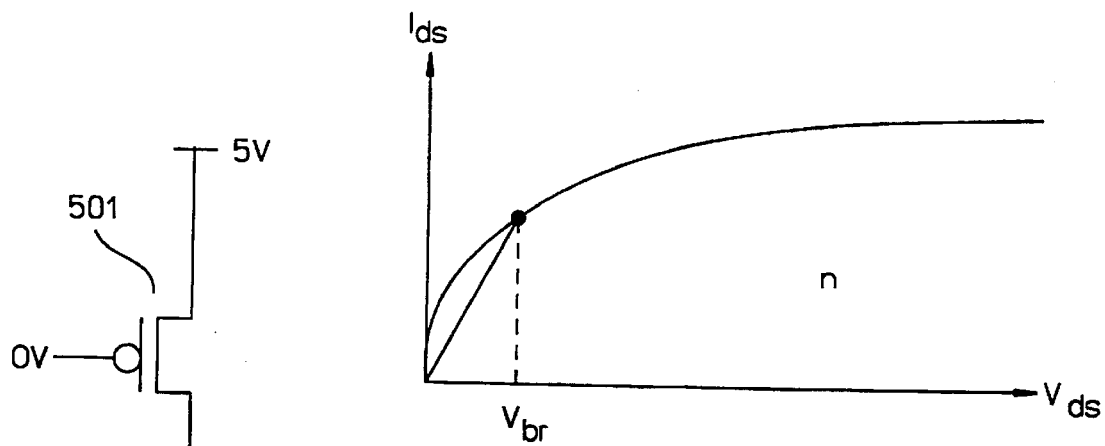
FIG. 5A
FIG. 5B
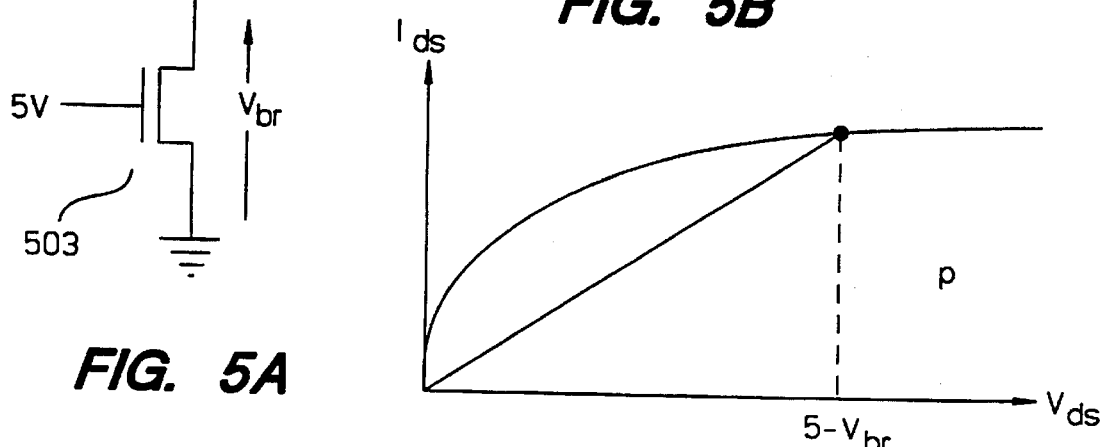
FIG. 5C

SYSTEM AND METHOD FOR MODELLING INTEGRATED CIRCUIT BRIDGING FAULTS

BACKGROUND OF THE INVENTION

The present invention pertains generally to electronic computer aided design systems for integrated circuit design and testing, and in particular to the modelling of bridging voltages caused by bridging faults.

Digital circuit fault modelling refers to the process of representing physical defects by the logic-level behavior they produce. By far the most common fault model used is the stuck-at model, which originally gained wide acceptance for bipolar circuits for which it is quite suitable. Because of its ease of use, it is also used for CMOS circuits, even though a significant number of researchers have shown that defective behavior of CMOS circuits can not be well-modelled by the stuck-at model.

The most common failure in CMOS integrated circuits is a short between physically adjacent conductors, giving rise to a bridging fault. Whereas some of these can be represented by stuck-at behavior (e.g. a short to $V_{dd}$ or GND), the majority can not. Tests generated using the stuck-at model typically have a very high coverage of bridging faults. However, there are at least two reasons why bridging faults need to be modelled directly. The first is that as the requirements for quality levels (expressed in terms of the fraction of parts which pass all tests but are in fact defective) become more stringent, the bridging faults which remain undetected can contribute to an unacceptably high reject rate. Further, because the detection of bridging faults using stuck-at tests relies on peripheral coverage, there is no guarantee of any coverage figure.

The second reason is concerned with fault diagnosis. While it is possible to use stuck-at test sets to diagnose bridging faults accurately, the procedure can be complex and if not done properly may not lead to correct diagnoses. If the fault to be diagnosed is really a bridging fault, it is better to model it directly and use this as the basis of a diagnosis procedure.

In both the above cases, current measurement techniques can be used both for increased observability of a bridge (described in T. Storey and W. Maly, "CMOS Bridging Fault Detection," Proc. Int. Test Conf., pp. 842–851 (1990); and Hawkins et al., "Quiescent Power Supply Current Measurement for CMOS IC Defect Detection," IEEE Trans. on Industrial Electronics, 36, pp. 211–218 (May 1989)) and in bridge fault diagnosis (Aitken, R. C., "A Comparison of Defect Models for Fault Location with $I_{ddq}$ Measurements," Proc. Int. Test Conf., pp. 778–787 (1992); and Chakravarty, S., & Liu, M., "Algorithms for Current Monitor Based Diagnosis of Bridging and Leakage Faults," Proc. 29th Design Automation Conf., pp. 353–356, (1992).

However, there is still a need for determining the voltage behavior of a bridge because not all designs are current-testable and normal logic-level testing can provide additional information to help in diagnosis.

Therefore, there is a need for a bridging fault model that is sufficiently accurate that it can be used for test generation, fault simulation and diagnosis. One of the most difficult problems to solve is that a bridge can result in varying voltage levels of the bridged nodes, these voltages being dependent on circuit state and input values. In many cases the level is high or low enough to be guaranteed to be interpreted as a 1 or 0 respectively. However, for intermediate voltages, the interpretation depends on the logic switching threshold of gates to which the bridged nodes are connected. This phenomenon is illustrated in FIG. 4, where the output of two NAND gates are shorted together. The logic thresholds of the two gates fed by these signals are shown in the figure (the threshold voltage values are obtained from a standard cell library).

A SPICE (a popular and well-known circuit simulation program) simulation of the underlying transistor circuit shows that the voltage on the bridged nodes will be 1.46V, which can be compared with the input thresholds of the gates driven by the bridged nodes. In this example, Q2 is connected to input B3 of AND2 gate 3, which has a threshold of 2.06V. Thus B3 interprets the voltage as a 0. Q1 is connected to input A4 of AND3 gate 4, which has a threshold of 1.35V. Consequently, A4 interprets the voltage as a 1. So, rather than causing a logical AND or logical OR, this bridge has caused the reversal of two values—a 1 has become a 0 and vice versa. This situation is described as the *Byzantine General* example shown in Acken, J. M., and Millman, S. D., "Fault Model Evolution for Diagnosis: Accuracy vs Precision," Proc. Custom Integrated Circuits Cont., pp. 13.4.1–13.4.4 (1992).

In order to model the above type of behavior, it is necessary to have information about the value of the bridged voltage. However, it is not realistic to carry out full circuit simulation since this would be far too time consuming. One approach was recently reported in Greenstein, G. S., and Patel, J. H., "E-PROOFS: A CMOS Bridging Fault Simulator," Proc. Int. Conf. on CAD, pp. 268–271 (1992), in which a gate level simulator was modified to allow low level switch and electrical simulation to be carried out in an analog region around the fault site. This is able to resolve the effects of intermediate voltages but can still result in long simulation times.

There have been a number of approaches taken to modelling bridging faults. A good review may be found in Acken & Millman (1992) (referenced above).

One approach to simulation of bridge faults is the voting model described in Acken, J. M., "Deriving Accurate Fault Models," Technical Report CSL-TR-88-365, Computer Systems Laboratory, Stanford University. The voting model was developed to take into consideration the fact that when two nodes driven to opposite logic values are shorted together, the resultant circuit can be viewed as a resistive divider between $V_{dd}$ and GND. The resistance to $V_{dd}$ comes from a combination of conducting p transistors and the resistance to GND comes from a combination of conducting n transistors. The concept of voting then becomes one of comparing the relative strengths (conductances) of the networks driving the node. Whichever has the greater strength determines whether the node is evaluated as a 1 or 0. This model is not intended to be used to determine actual voltages. However, as the previous example shows, the winner of a drive fight can depend on the observer, so that a simple vote will not predict true behavior.

In order to obtain accurate representations of the strengths of various combinations of series and parallel transistors, the model was refined in Acken & Millman (1991). Here SPICE simulations were done to determine the relative strengths of networks consisting of from one to four series connected transistors of the same type (n or p) and one to four parallel connected transistors. Because of nonlinearities in operation, the resistance of a series combination does not increase linearly. For example, two n transistors conduct 0.63 as much current as a single transistor, rather than 0.5.

The results of the above simulations are stored in a table which can be accessed to determine the winner of a vote. In this way no SPICE simulations need to be done during fault simulation. The implicit assumption made in this approach is that all observers have the same threshold. The approach was further refined in Acken & Millman (1992) where varying thresholds are taken into account. Here the results of the SPICE simulations are stored as a definite vote winner only if the resultant node voltage falls outside the range of thresholds of the logic library used (Millman, 1992). That is, the n combination wins only if the node voltage is lower than the lowest threshold of any input of any gate in the library, and similarly for a p winner. If the simulated voltage falls within this range, another set of tables is used where the particular n-p combination (e.g. single p fighting two series n devices) is simulated for each gate input and the winner noted, where the vote is with respect to the threshold of the particular gate input.

That approach has a few shortcomings. First, it is not completely general, in that if any new logic element is introduced which has a threshold which is outside the range which was used to generate the tables, then new tables must be generated. These tables can also be large, because in typical standard cell libraries, as well as in custom designs, there are a large number of logic elements, each in a number of drive sizes. This fact can result in a wide range of possible strengths, many of which will not be integer values. For example, a p of width 50.2 could be fighting an n of width 36.4. While the fractional widths may not make much difference for large transistors, they can be important for small ones. Thus, there is a need for a bridging fault simulation system which takes different transistor sizes into account.

Finally, additional entries are required to deal with complex combinations of transistors found in complex gates such as AND-OR-INVERT cells. SPICE simulations indicate that one cannot simply add up resistances of devices in series. Therefore, a method is needed for bridge fault simulation of devices with series combinations of parallel devices.

Other aspects and advantages of the present invention will become apparent from the following detailed description, taken in conjunction with the accompanying drawings, illustrating by way of example the principles of the invention.

BRIEF DESCRIPTION OF THE DRAWINGS

The invention will be readily understood by the following detailed description in conjunction with the accompanying drawings, wherein like reference numerals designate like structural elements, in which:

FIG. 4 is an example logic circuit having a bridging fault.

FIG. 5(a) is a transistor circuit having a single n transistor fighting a single p transistor.

FIG. 5(b) is the $I_{ds}$ versus $V_{ds}$ characteristics for the n transistor of FIG. 5(a); and FIG. 5(c) is the $I_{ds}$ versus $V_{ds}$ characteristics for the p transistor of FIG. 5(a).

DETAILED DESCRIPTION OF THE PREFERRED EMBODIMENTS

The present invention is a method and system for electronic computer aided design incorporating bridge fault simulation without requiring detailed circuit simulation during the fault simulation and without requiring the use of large quantities of information. The present invention accurately estimates bridged voltages.

Figure 1:
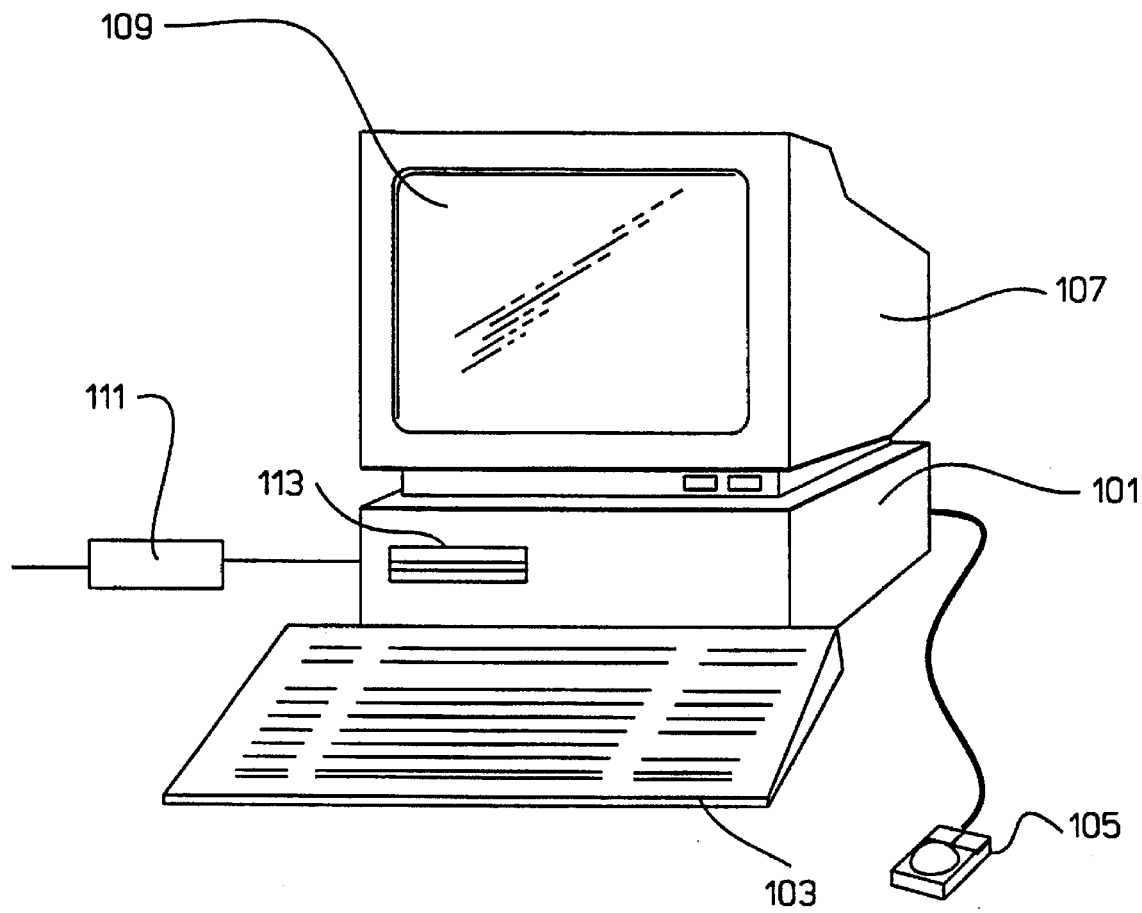
FIG. 1 is a perspective view of a preferred embodiment computer work-station for ECAD according to the present invention.

FIG. 1 is a perspective view of a preferred embodiment computer work-station 100 for ECAD (Electronic Computer Aided Design) according to the present invention. A computer 101 is connected to a key-board 103, a pointing device 105 (e.g., a mouse or a light-pen), and a monitor 107. The computer 101 may be further connected to a computer network through connector 111 or operate in a stand-alone fashion.

The computer 101 contains a disk-drive 113 for inputting data and programs. The monitor 107 contains a screen 109 for displaying a windowing interface to a user.

Figure 2:
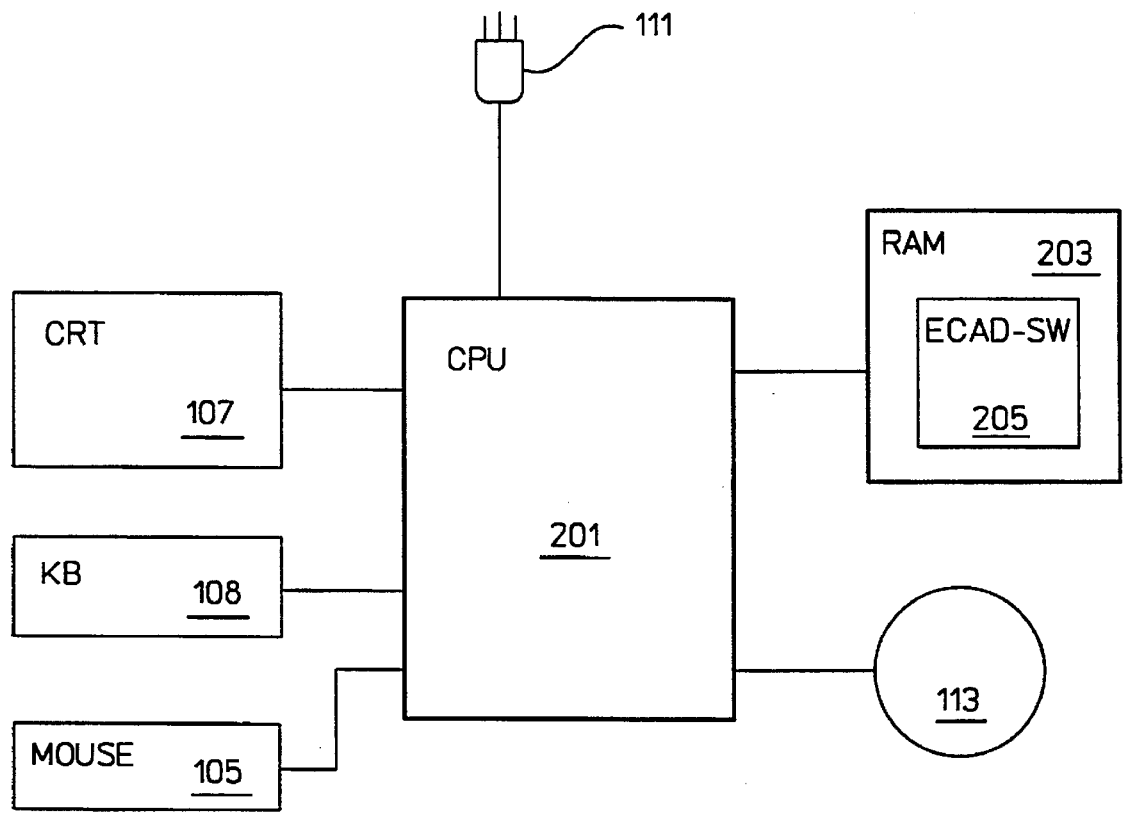
FIG. 2 is a schematic of the work-station of FIG. 1 according to one embodiment of the present invention.

FIG. 2 is a schematic of a work-station 100 according to one embodiment of the present invention. A central processing unit (CPU) 201 is connected to the various peripheral devices 107, 103, 105, and 113. Additionally the CPU 201 is connected to a random-access-memory (RAM) 203. The CPU 201 is operable to execute ECAD software 205. During the execution of the ECAD software 205, it is loaded into the RAM 203.

Figure 3A:
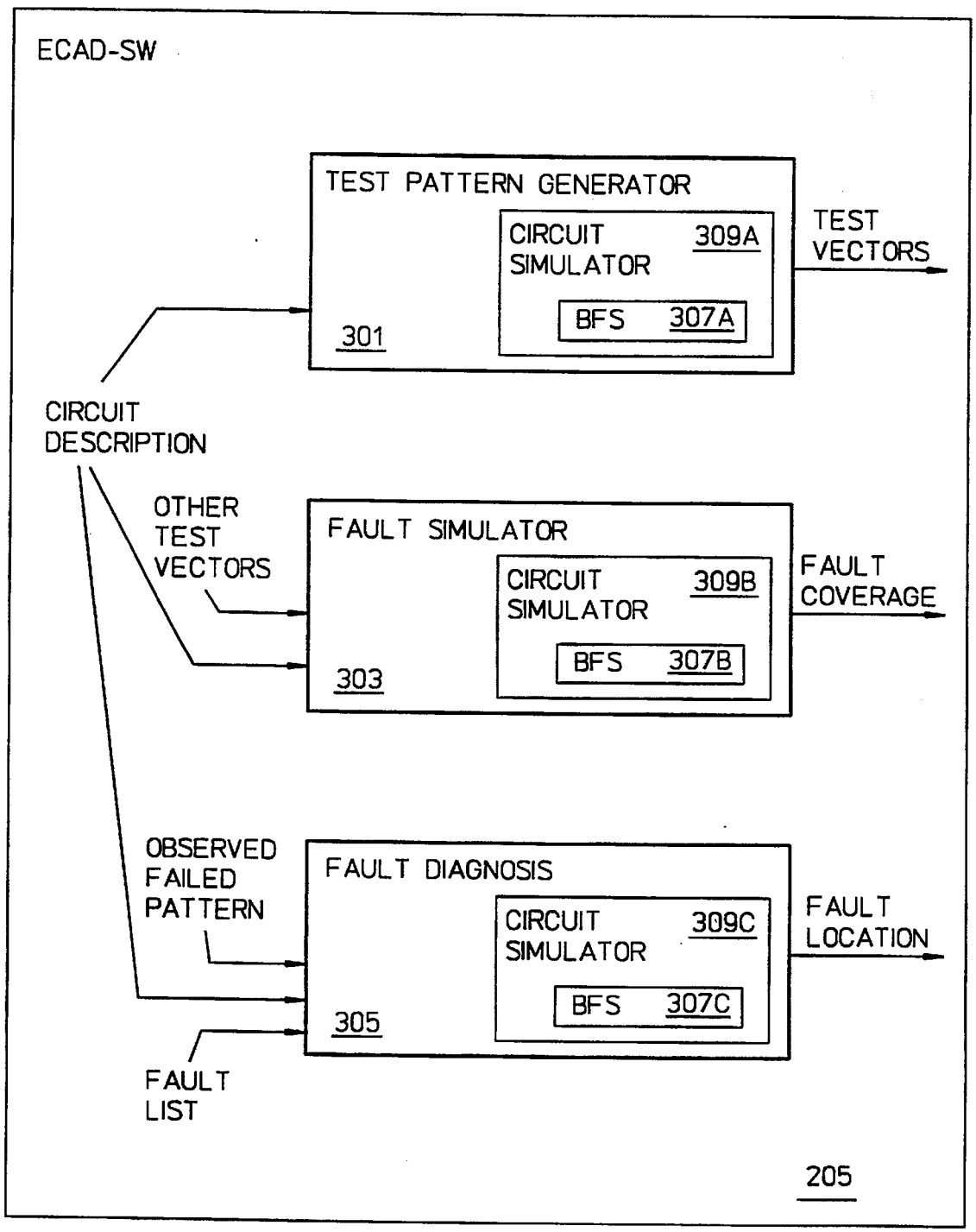
FIG. 3(a) is a schematic of one embodiment of the ECAD software of FIG. 2 according to the present invention.

FIG. 3(a) is a schematic of one embodiment of the ECAD software 205 according to the present invention. A test pattern generator (TPG) 301 is logically connected to a fault simulator 303. The TPG 301 produces test patterns which are fed into the fault simulator 303.

The ECAD software 205 also consists of a fault diagnosis tool 305. The fault diagnosis tool 305 accepts observed failed patterns and a fault list as its inputs, and outputs one or more fault locations.

A description of the circuit under consideration is input to the TPG 301, the fault simulator 303, and the diagnosis tool 305.

Each of the test pattern generator 301, the fault simulator 303, and the fault diagnosis tool 305, contains a circuit simulator 309a–c, respectively, which each in turn contains a bridge fault simulator 307a–c, respectively, according to the present invention. The bridge fault simulators 307a–c are described below in conjunction with FIGS. 5 through 13.

Figure 3B:
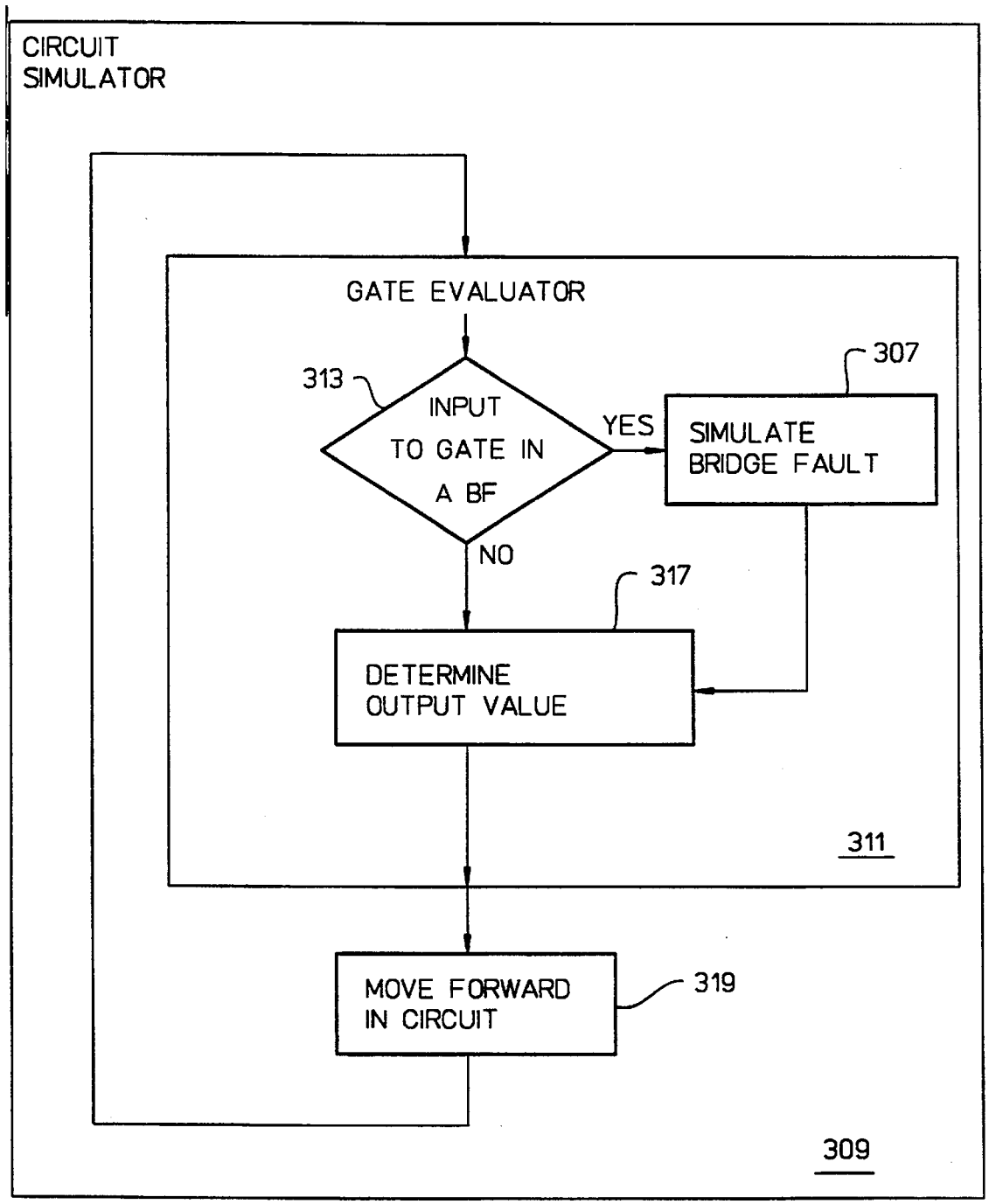
FIG. 3(b) is a block diagram of a circuit simulator.

FIG. 3(b) is a block diagram of a circuit simulator 309. In addition to other simulation modules, the circuit simulators 309 each contain a gate evaluator 311. The gate evaluator determines whether an input to a particular gate under evaluation is a bridging node, e.g., the subject of a bridge fault, decision block 313. If such is the case the gate evaluator calls upon the bridge fault simulator 307 to simulate the effect of such fault. The output of the simulation is whether the bridge voltage is a logic one or a logic zero. This information is then used to determine the output of the gate, step 317. Following the evaluation of the gate, the simulator moves forward to the next level of gates in the circuit, step 319.

The method and system of simulating bridging faults according to the present invention is based on the fact that the voltage of the bridged nodes is determined by the effective conductances of the p and n portions at the particular value of the bridged voltage. The voting model in its simplest form evaluates these at one voltage only. The table of effective strengths of various transistor combinations given in Acken & Millman (1991) is true only when there is 2.5V across both the n and p sections. These strengths change as the voltage changes.

FIG. 5 illustrates the above by using a single n transistor 503 fighting a single p transistor 501, as shown in FIG. 5(a). The $I_{ds}$ versus $V_{ds}$ characteristics of each device are also shown (qualitatively) in FIG. 5(b) (for the n transistor 503) and FIG. 5(c) (for the p transistor 501). At any given stable bridge voltage $V_{br}$ the conductance of each device is given by the slope of the line connecting the operating point on the characteristic to the origin.

It can be seen that as $V_{br}$ becomes smaller, compared to their values at 2.5V the conductance of the n device, $C_n$, increases while that of the p device, $C_p$, decreases. The strength of a given sized device therefore is dependent on circuit configuration.

Figure 6A:
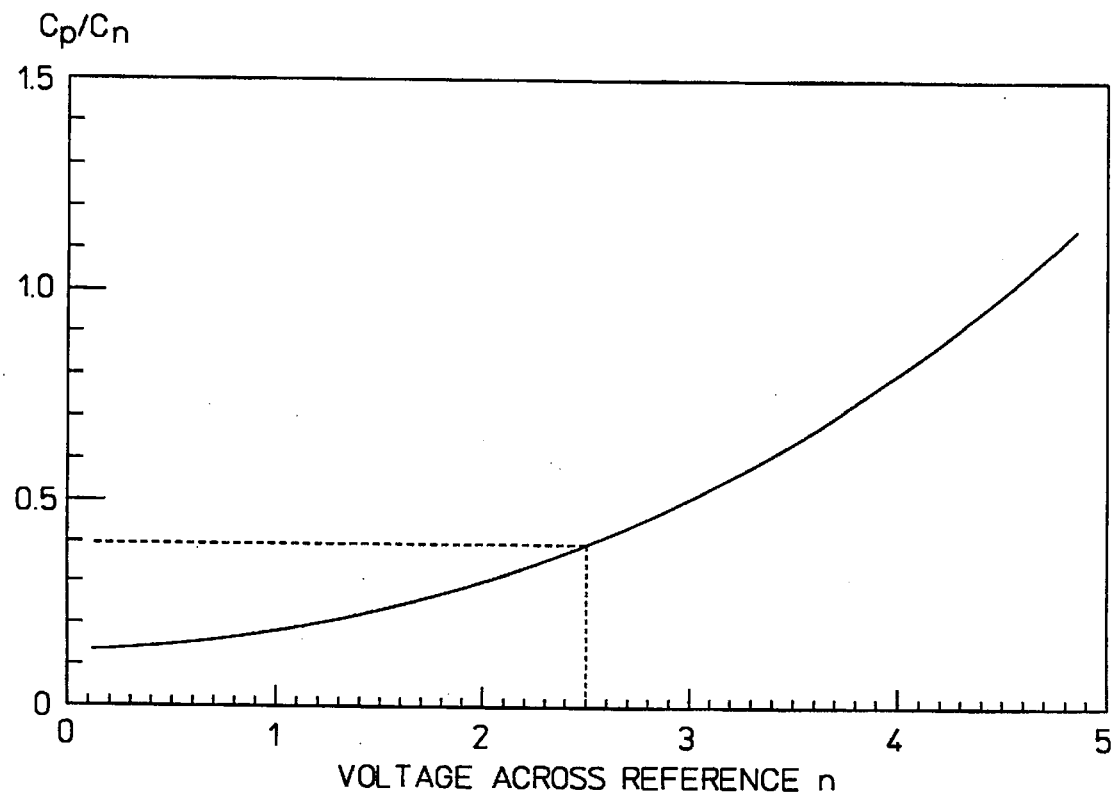
FIG. 6(a) is a graph of the variation of conductance of a circuit with one p transistor relative to the conductance of one n transistor as a function of bridging voltage in the range from 0V to 5V.
Figure 6B:
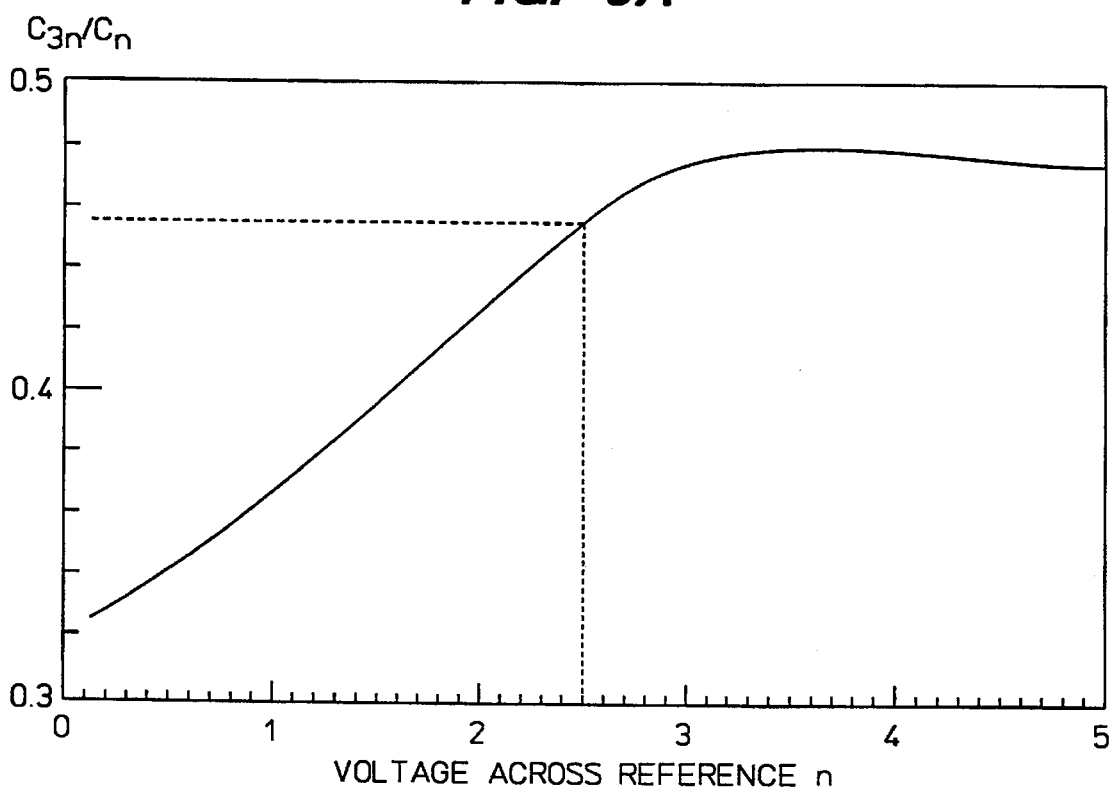
FIG. 6(b) is the graph of conductance of a circuit having three n transistors in series relative to the conductance of one n transistor as a function of bridging voltage in the range from 0V to 5V.

In order to characterize this effect, a SPICE simulation is executed on the circuit of FIG. 5(a) with unit-sized devices and forcing the value of $V_{br}$ by connecting the junction of the two devices to a voltage source. The ratio of the two conductances gives the strength of the p device, expressed as a fraction of the strength of the n device. FIG. 6(a) is a graph of the variation of $C_p/C_n$ as $V_{br}$ ranges from 0V to 5V. Similar curves are derived for more than one p or n device in series. FIG. 6(b) shows the curve for three n devices in series. For devices in parallel, the strengths of the devices are summed.

Figure 7:
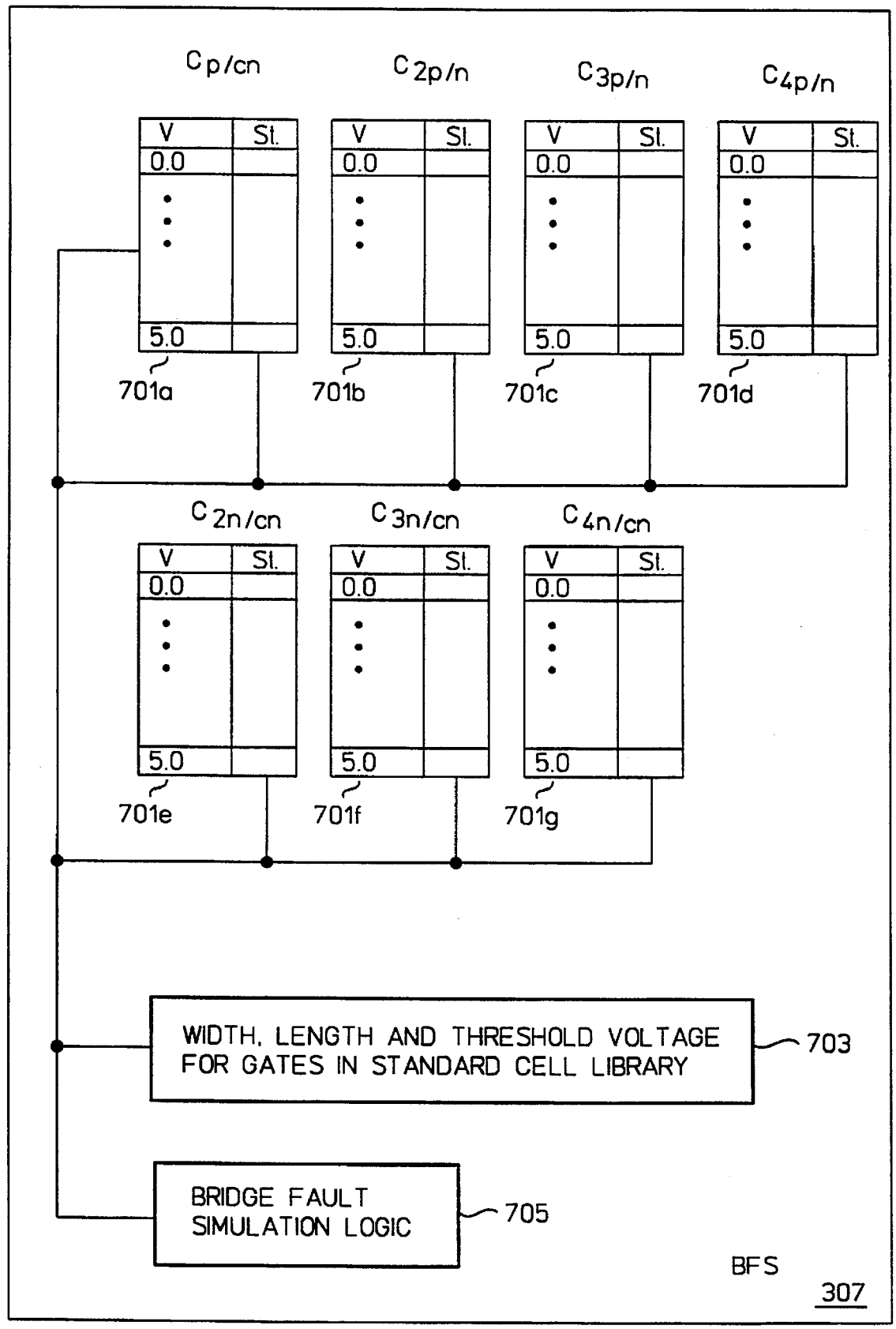
FIG. 7 is a block diagram of one embodiment of a bridge fault simulator according to the present invention.

FIG. 7 is a block diagram of one embodiment of the bridge fault simulator 307, according to the present invention. The information in the curves shown in FIGS. 6(a) and 6(b) and for other n and p is stored in tables 701(a) through 701(g), one for each series combination. The number of these tables is small, being the maximum number of series devices likely to be encountered in a design. For a typical cell library this number would be four or five. For a cell library with more than four transistors in series, additional tables would be present beyond those shown in FIG. 7. In one embodiment, each table is discretized to 0.1V increments in $V_{br}$. The table entries represent strengths for unit-dimensioned devices and are multiplied by the actual W/L ratio to obtain the true strength. Table 1 is an example of the table 701(a) and Table 2 is an example of table 701(e).

TABLE 1

Relative strength for one p transistor

| Voltage | Relative Strength |
|---|---|
| 0.1 | 0.125 |
| 0.2 | 0.129 |
| 0.3 | 0.134 |
| 0.4 | 0.140 |
| 0.5 | 0.146 |
| 0.6 | 0.152 |
| 0.7 | 0.158 |
| 0.8 | 0.165 |
| 0.9 | 0.173 |
| 1.0 | 0.180 |
| 1.1 | 0.189 |
| 1.2 | 0.198 |
| 1.3 | 0.208 |
| 1.4 | 0.218 |
| 1.5 | 0.229 |
| 1.6 | 0.241 |
| 1.7 | 0.254 |
| 1.8 | 0.268 |
| 1.9 | 0.282 |
| 2.0 | 0.298 |
| 2.1 | 0.315 |
| 2.2 | 0.333 |
| 2.3 | 0.352 |
| 2.4 | 0.373 |
| 2.5 | 0.395 |
| 2.6 | 0.418 |
| 2.7 | 0.442 |
| 2.8 | 0.467 |
| 2.9 | 0.493 |
| 3.0 | 0.519 |
| 3.1 | 0.545 |
| 3.2 | 0.573 |
| 3.3 | 0.601 |
| 3.4 | 0.630 |
| 3.5 | 0.659 |
| 3.6 | 0.688 |
| 3.7 | 0.719 |
| 3.8 | 0.749 |
| 3.9 | 0.781 |
| 4.0 | 0.813 |
| 4.1 | 0.846 |
| 4.2 | 0.879 |
| 4.3 | 0.913 |
| 4.4 | 0.947 |
| 4.5 | 0.981 |
| 4.6 | 1.017 |
| 4.7 | 1.053 |
| 4.8 | 1.090 |
| 4.9 | 1.127 |

TABLE 2

Relative Strength for two n transistors.

| Voltage | Relative Strength |
|---|---|
| 0.1 | 0.504 |
| 0.2 | 0.508 |
| 0.3 | 0.512 |
| 0.4 | 0.517 |
| 0.5 | 0.522 |
| 0.6 | 0.526 |
| 0.7 | 0.531 |
| 0.8 | 0.536 |
| 0.9 | 0.542 |
| 1.0 | 0.547 |
| 1.1 | 0.552 |
| 1.2 | 0.558 |
| 1.3 | 0.564 |
| 1.4 | 0.569 |

TABLE 2-continued

Relative Strength for two n transistors.

| Voltage | Relative Strength |
|---|---|
| 1.5 | 0.575 |
| 1.6 | 0.580 |
| 1.7 | 0.586 |
| 1.8 | 0.591 |
| 1.9 | 0.597 |
| 2.0 | 0.602 |
| 2.1 | 0.608 |
| 2.2 | 0.613 |
| 2.3 | 0.618 |
| 2.4 | 0.623 |
| 2.5 | 0.628 |
| 2.6 | 0.633 |
| 2.7 | 0.637 |
| 2.8 | 0.640 |
| 2.9 | 0.642 |
| 3.0 | 0.642 |
| 3.1 | 0.642 |
| 3.2 | 0.641 |
| 3.3 | 0.641 |
| 3.4 | 0.641 |
| 3.5 | 0.641 |
| 3.6 | 0.640 |
| 3.7 | 0.640 |
| 3.8 | 0.639 |
| 3.9 | 0.639 |
| 4.0 | 0.639 |
| 4.1 | 0.638 |
| 4.2 | 0.638 |
| 4.3 | 0.638 |
| 4.4 | 0.638 |
| 4.5 | 0.637 |
| 4.6 | 0.637 |
| 4.7 | 0.637 |
| 4.8 | 0.636 |
| 4.9 | 0.636 |

The important feature of the tables 701 is that they provide a means for determining the strength of a circuit relative to a reference circuit as a function of voltage. Another way of achieving this functionality is to provide functions that return the value of the relative strength as a function of voltage. Such a function can be an empirical function derived from the data or an analytical function for computing the relative strength based on some physical characteristics of the circuit. Furthermore, while the reference device in the tables 701 is one n transistor, any uniform reference circuit may be used, e.g., one p transistor.

In one embodiment, because a bridged node can be interpreted differently by different gates, each input is treated separately. To determine if the bridged voltage is above or below a given threshold, the relative strengths of the p and n networks are compared on a weighted basis, the weight deriving from the ratio of strengths required to produce the particular threshold under consideration.

For example, consider a threshold of 1.6V. For a circuit to produce such a bridged voltage, the ratio of the strengths of the p and n networks is 1:2.125. This reference ratio is used to determine the outcome of the vote. If the n network is stronger than 2.125 times the p network then it wins, otherwise the p network wins. In this regard, the required ratio may be viewed as biasing the outcome of the voting procedure.

The strengths used for the vote are derived from the stored tables. That is, they represent the true strengths at the threshold in question.

Returning to FIG. 7, the bridge fault simulator 703 contains a data structure 703 for storing the width, length and threshold voltage information for gates in the cell library. The information stored in the data structure 703 may be retrieved once from the cell library. The threshold voltages may not be available from the cell library, in which case they are derived using SPICE simulations. In a custom environment newly created cells can be characterized and their widths, lengths, and threshold voltages entered into the data structure 703. The results from the SPICE simulations are stored in the data structure 703.

The calculation of relative strengths to be stored in the tables 701 is done once and stored in the tables for use during subsequent bridge fault simulations.

The bridge fault simulator 703 also consists of bridge fault simulation logic 705 for accessing the data in the tables 701 and data structure 703 and operable to execute the procedures for bridge fault simulation according to the present invention. The operation of the bridge fault simulation logic 705 is described below in conjunction with FIGS. 8-13.

Figure 8:
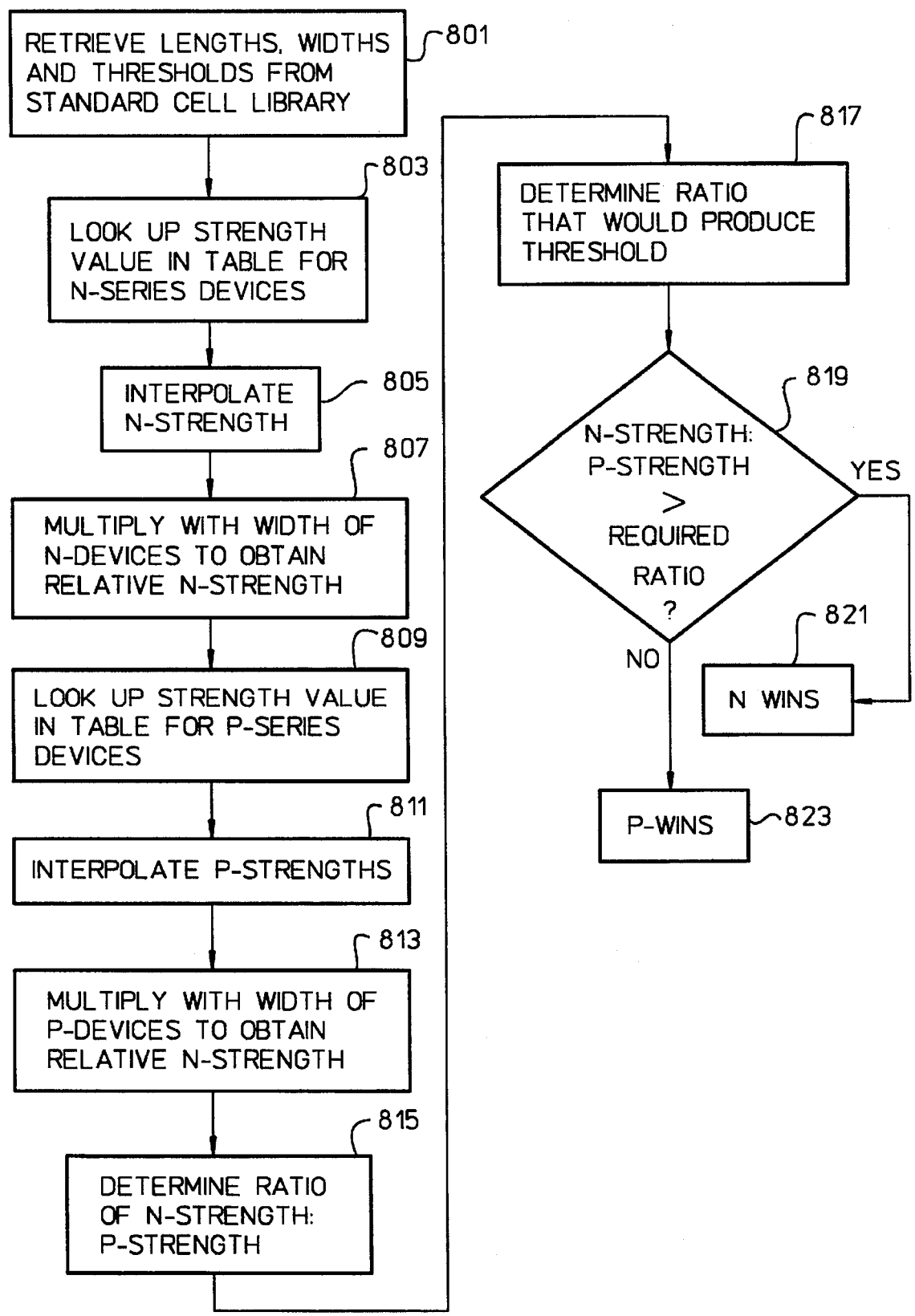
FIG. 8 is a flow diagram of the procedure for determining whether the n network or the p network wins according to the present invention.

FIG. 8 is a flow diagram of the procedure for determining whether the n network or the p network wins. The example of FIG. 4 illustrates this procedure. The first step is to retrieve width, length and threshold data from data structure 703, step 801. In the example of FIG. 4, the p network consists of a single device with width 31.1μ and the n network is two devices in series with widths 31.2μ. The lengths in both cases are 1μ. Gate 3 has a threshold of 2.06V and gate 4 a threshold of 1.35V.

The next step is to retrieve the strength value of a unit sized network like the n network from the appropriate table 701, step 803. In the case of the example of FIG. 4, the n network consists of two series n transistors. Therefore, the appropriate table is the table 701b. This table 701e is also shown above as Table 2.

Because the threshold voltage is 2.06V, there is no exact entry in the table 701b. Therefore an interpolation between the values at 2.0V (0.602) and 2.1V (0.608) in the table is executed, step 805. In the example, this interpolation shows the strength of two unit-dimensioned n devices in series is 0.606.

Next the unit strength of the n network is multiplied by the width-length ratio (W/L) of the network, step 807. In the example of FIG. 4, the cell library data indicates (from step 801) that the W/L of the n transistors is 31.2. Therefore, the final n strength is 0.606×31.2=18.91.

In a similar manner, from the p table 701a (Table 2), the strength of a single p is 0.308, step 809 (retrieval) and 811 (interpolation). The final p strength is then 0.308×31.1=9.58, step 813.

Next the ratio of n strengths to p strengths is determined, step 815. In the example, the ratio of strengths is 18.91/9.58=1.97.

Next the ratio that would produce the desired threshold voltage is determined, step 817. The ratio is $V_{br}/(5.0-V_{br})$. For a circuit to actually produce 2.06V the ratio would have to be 1.43.

Next, n strength to p strength ratio (from Step 815) is compared to the required ratio for the threshold voltage (from Step 817), step 819. If the former is greater than the latter, n wins, step 821, otherwise, p wins, step 823. Therefore in the example of FIG. 4, n wins.

In the example of FIG. 4, for gate 4, the threshold is 1.35V. Similar calculations to the above give a reference ratio of 2.7 and the circuit ratio, evaluated at 1.35V, is 2.67, indicating that the p (marginally) wins the vote.

The procedure shown in the flow chart of FIG. 8 is an embodiment of a procedure for determining whether the actual bridge voltage is above or below a given threshold. An alternative embodiment, in which the information stored in the tables 701 and the data structure 703 is used to estimate the actual bridge voltage of a bridged node, is shown in the flow chart of FIG. 9. It is an iterative procedure that consists of the following steps:

Determine the strengths at 2.5V of the p and n networks, step 901.

Use these strengths to calculate a first voltage, based on resistive division, step 903.

Use the first voltage and the stored tables 701 to determine the new value of the strengths, step 905.

Calculate a second voltage using the new strengths, step 907.

If the new voltage differs from the previous by less than a predetermined amount, decision block 909, go to interpretation phase, step 913, otherwise set the first voltage to equal the second voltage, step 911, and go to step 905.

After the bridge voltage has been accurately estimated using the iterative procedure of steps 905 through 911, it is used to determine the downstream interpretation by the gates whose inputs are connected to the bridge node, step 913. This step involves comparing the threshold voltages of those gates to the bridge voltage.

The procedure is approximate. In a preferred embodiment a difference of 0.1V in decision block 909 gives reasonable results.

Using the example in FIG. 4 again, the process starts by obtaining the strength values at 2.5V from the tables 701, step 901. The value for two unit-dimensioned n devices in series is 0.628, which when multiplied by W/L gives the strength in our case to be 0.628×31.2=19.59. Similarly, the strength of a single p is 0.395 which is multiplied by the W/L of 31.1 to give a strength of 12.29. These give an initial estimate of 1.93V, step 903.

Using this first voltage value, from consulting the table entries for 1.9V and 2.0V and linearly interpolating, the n strength and p strength become 18.67 and 8.92, respectively, giving a voltage of 1.62V, step 907. Proceeding in this fashion gives the next voltage value as 1.47V and the next 1.41V which is within a 0.1V difference. A SPICE simulation of the same circuit has shown the bridging voltage to be 1.46V.

Figure 10:
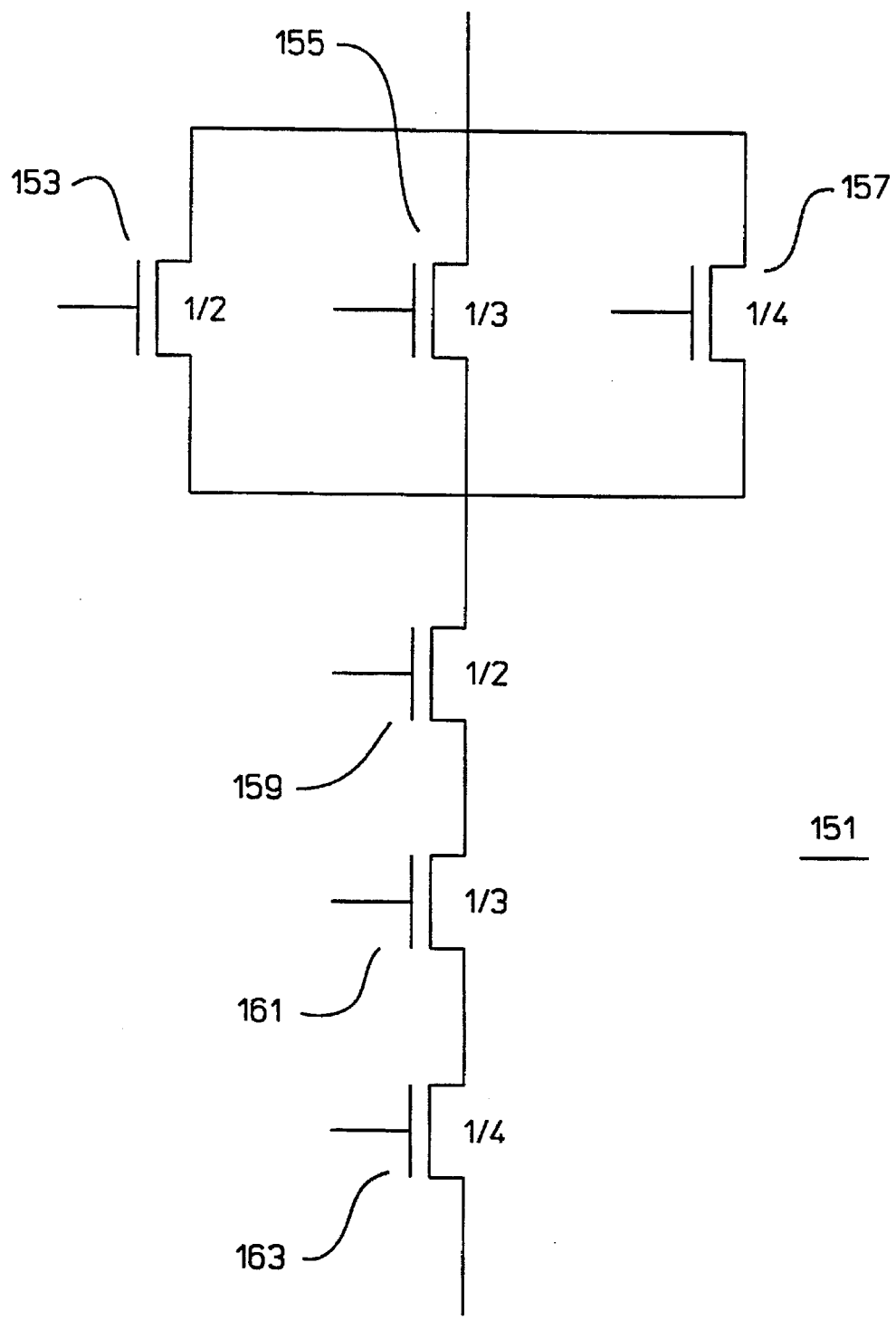
FIG. 10 is a transistor circuit having both parallel and series devices.

The above example represents a simple combination of transistors. When more complex structures exist the problem is how to determine the strengths. A preferred embodiment according to the present invention uses the concept of average resistance. This is illustrated in FIG. 10 by way of example. In the network of transistors 101, all of the transistors are conducting. The L/W ratios for each device is indicated next to the device (i.e., device 153 has a L/W ratio of 1/2, etc.). Whereas W/L ratios correspond to the conductance of the device, the L/W ratios correspond to the resistance of the device.

The network 151 is replaced with four identical devices, each having the average resistance of the structure. Because the conductances of parallel devices may be summed, the effective L/W of the parallel components is 1/9. Thus, the average resistance is given by $$R_{ave} = \frac{1/9 + 1/2 + 1/3 + 1/4}{4} = 0.299$$

The network is then replaced with four devices with conductance 1/0.299=3.35. The strength of this network is then obtained by multiplying this value by the appropriate entry from the table for four n transistors in series, the table 701g.

Figure 11:
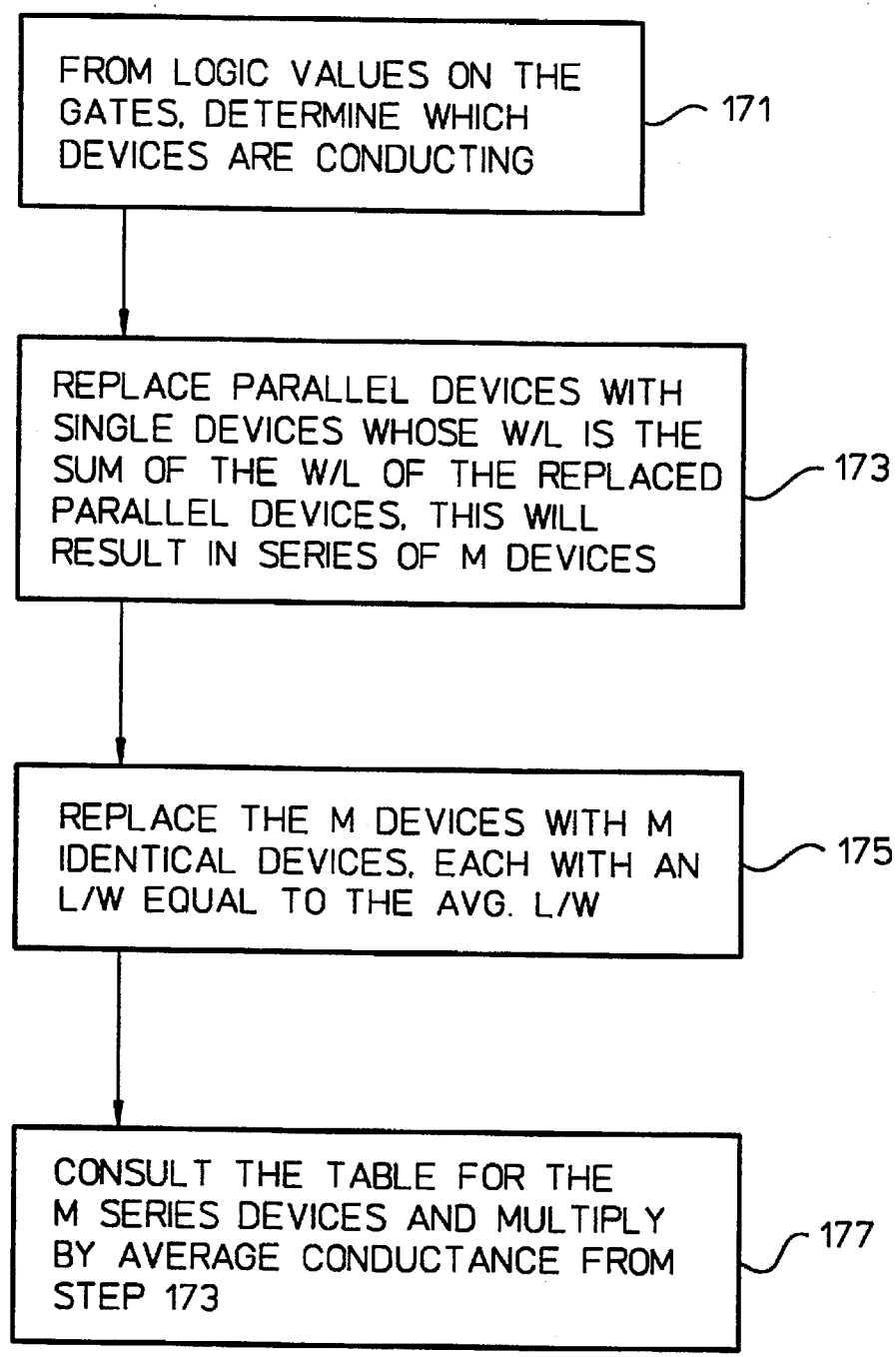
FIG. 11 is a flow chart of the algorithm for determining strengths according to one embodiment of the invention.

A flow chart of the algorithm for determining strengths in complex circuits is shown in FIG. 11 and contains the following steps:

From the logic values present on the gates of the transistors, determine which devices are conducting, step 171.

Replace all parallel conducting devices with a single device whose W/L is the sum of the W/L's of the replaced devices, step 173. This results in a network of m devices in series.

Replace the m devices with the same number of identical devices, each of which has a L/W equal to the average L/W of the m series devices, step 175.

Consult the table 701 for m series devices and multiply the entry by the average conductance obtained in step 173. This value is the equivalent strength of the circuit relative to the strength of a circuit having one n transistor.

Steps 171 through 175 is then carried out for the competing circuit (i.e., if it was first executed for the n circuit, it is then carried out for the p circuit). The two relative strengths are then fed into the procedure of FIG. 8 at step 815, so that a winner can be determined.

Thus, if a network has m series connected components, with component i having $k_i$ parallel devices, the average conductance is given by:

$$C_{avg} = \frac{m}{\sum_{i=1}^{m} C_i^{-1}}$$

where, $$C_i = \sum_{j=1}^{k_i} \frac{W_j}{L_j}$$

To demonstrate the effectiveness of this approach, the network in FIG. 10 was connected to an identical p network except for the omission of the transistor 161 and the transistor 163 series devices. The SPICE voltage for this combination was 1.35V while the method of FIG. 11 gave 1.38V and 1.33V on the 3rd and 4th iteration respectively.

Figure 9:
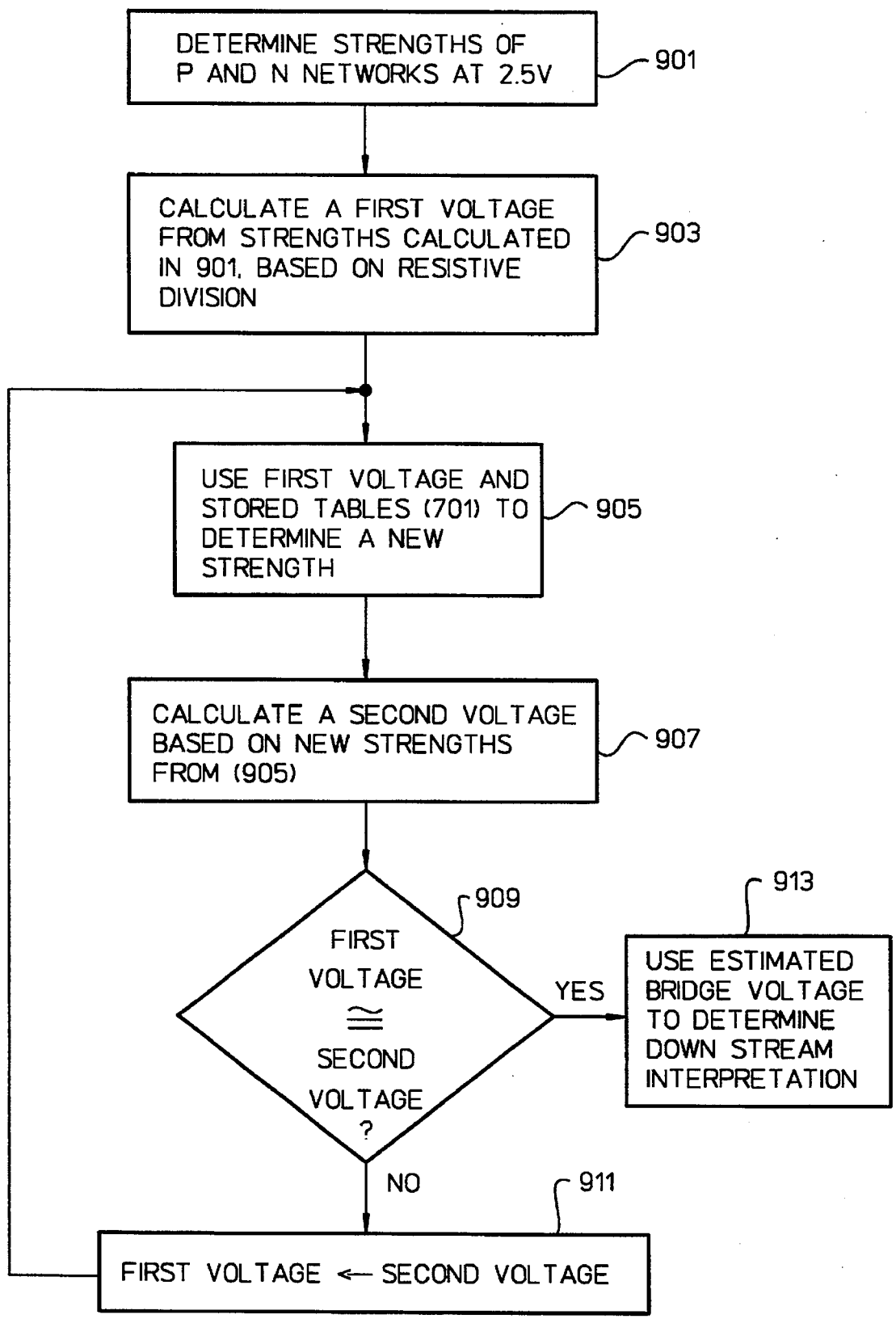
FIG. 9 is a flow chart of the procedure for determining the bridging voltage of a bridged node.

The technique as described in conjunction with FIGS. 8, 9, and 11 works well for non-feedback bridging faults. Feedback faults require special consideration because of the possibility of their giving rise to oscillations and latching behavior. A taxonomy of feedback faults follows in conjunction with the description of FIGS. 12 and 13.

Figure 12A:
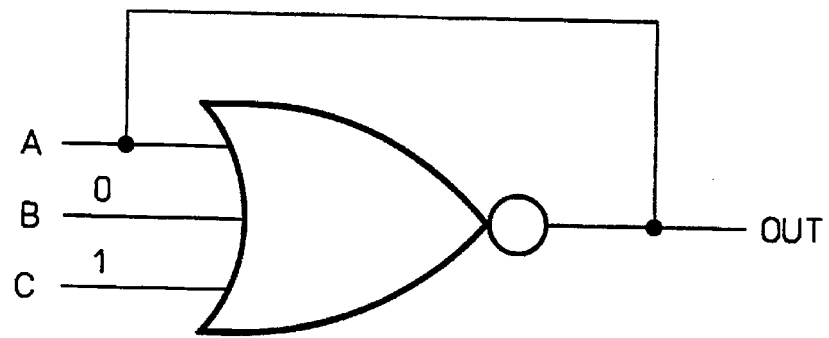
FIG. 12(a) is a gate circuit exhibiting a non-sensitized feed back bridging fault.
Figure 12B:
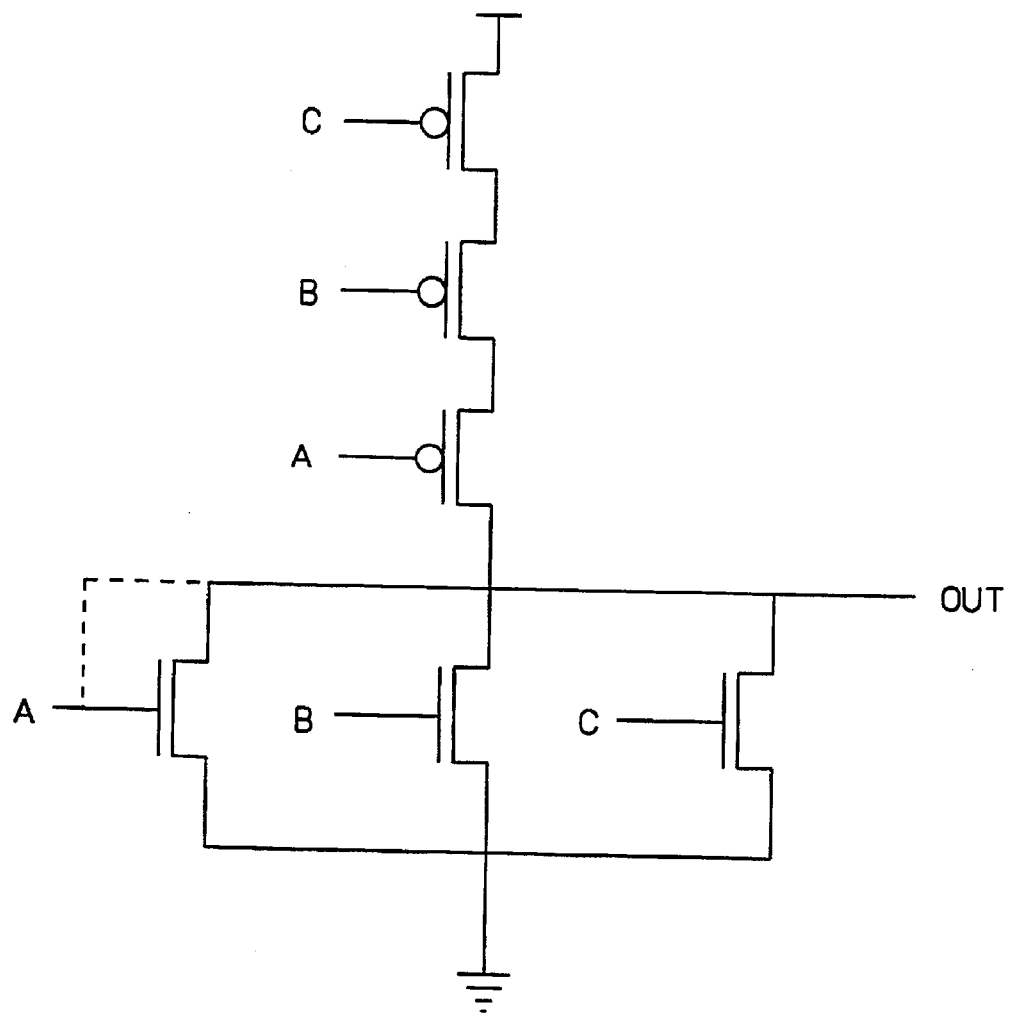
FIG. 12(b) is a transistor circuit equivalent to the gate circuit of FIG. 12(a).

FIG. 12(a) illustrates a non-sensitized feedback situation. FIG. 12(b) is the equivalent transistor circuit for the gate circuit of FIG. 12(a). In this case, no path from the forward node to the backward node is sensitized, one or more gates on each path having a controlling value on another input. When more than one gate is involved between the forward and backward node the situation is the same as a non-feedback fault and can be dealt with as before.

If the bridge is from output to input of a single gate, the biased voting procedure works correctly with the minor addition of tables of strengths for a p and n transistor with a gate-to-drain short. This is illustrated in FIG. 12, where the controlling 1 on input C turns off the series connection and the pull-down strength is then simply the sum of the strengths of the normal C FET and the A FET with a gate-to-drain short. Similar arguments apply for a NAND gate. For complex gates the procedure is valid only for certain non-sensitized cases. In a standard cell library, typically the only complex gates are AND-OR-INVERT, OR-AND-INVERT, EXOR and EXNOR.

Figure 13A:
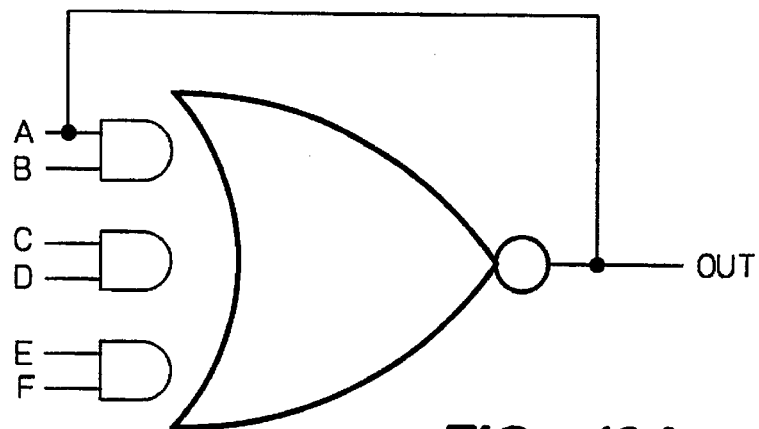
FIG. 13(a) illustrates a feed-back bridging fault around a complex gate.
Figure 13B:
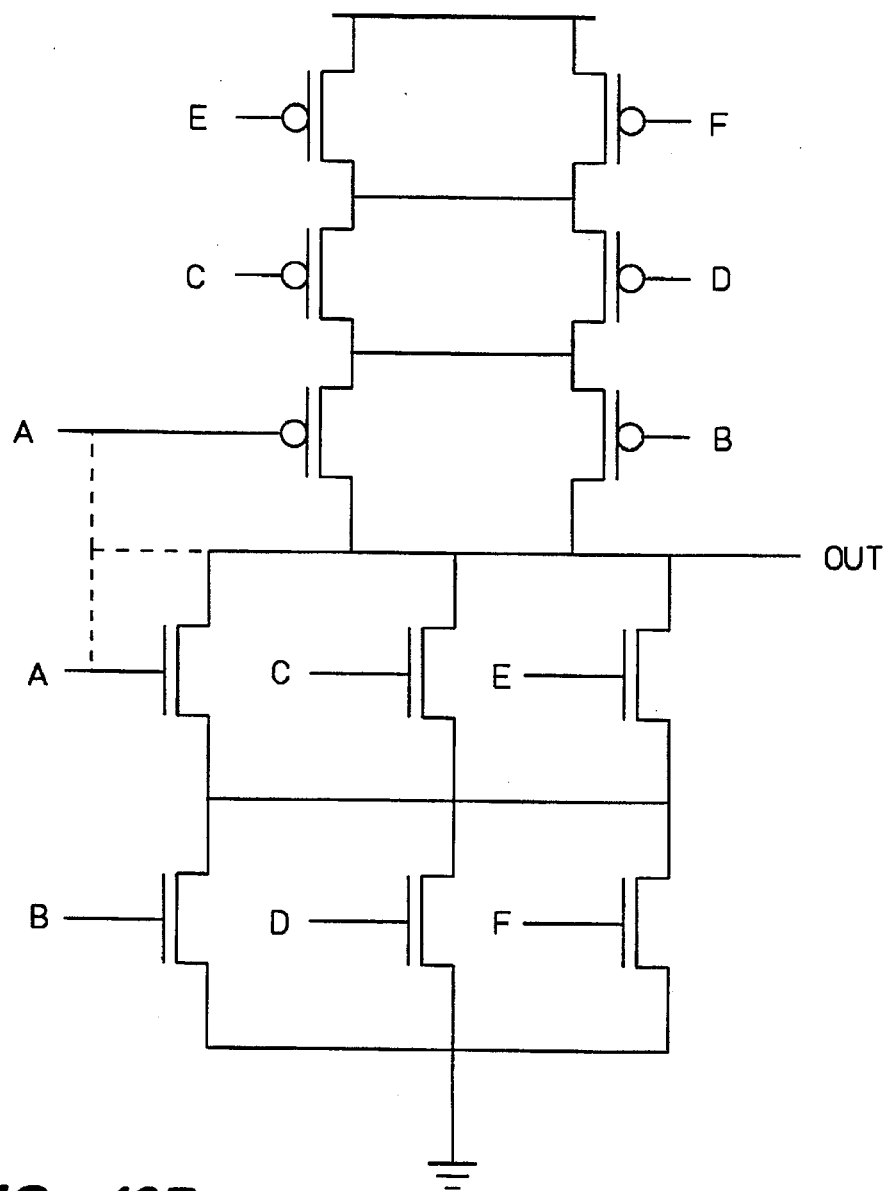
FIG. 13(b) is a transistor circuit equivalent to the gate circuit of FIG. 13(a).

For the AND-OR-INVERT and OR-AND-INVERT gates the concept of non-sensitization has to be extended to require a controlling value on both the first and second level equivalent gates. This is illustrated in FIG. 13, where the fault is non-sensitized if both B=0 and either C=D=1 or E=F=1. Under these conditions the voting procedure will produce correct results.

In some cases, which may be referred to as "sensitized feedback" cases, SPICE is required to resolve the situation, even when multiple gates are involved in the loop. This is because of the possibility of oscillations and latching behavior. However, the procedures of FIGS. 8, 9, and 11 may be used in some cases, as discussed below.

A first such situation is where there is an odd number of inversions. This represents a situation where there are potential oscillations. If the predicted bridged voltage falls near the logic threshold of the gate input which is connected to the backward node then oscillation is likely. To be conservative the bridged node is marked as unknown if its predicted voltage is within 0.5V of the appropriate logic threshold. In all other cases the procedures of FIGS. 8, 9, and 11 may be used effectively. In some situations this results in a stable voltage for one state of the driving gate and an unknown for the opposite state.

A second "sensitized feedback" situation is where there is an even number of inversions. Rather than being susceptible to oscillations, a feedback bridge with an even number of inversions is susceptible to latching. The criteria for latching behavior are similar to those discussed above for oscillations, namely, the final predicted voltage being near the logic threshold of the backward gate. A value within 0.5V is marked as writing the latch, resulting in a value which is the full logic value of the output of the backward driving gate. Because of uncertainties in close values, the voting procedure is used only if the predicted value is not within 0.8V of the appropriate threshold. Intermediate values are marked as requiring SPICE.

Other embodiments of the invention will be apparent to those skilled in the art from a consideration of this specification or practice of the invention disclosed herein. All publications cited in this specification are incorporated by reference. It is intended that the specification and examples be considered as exemplary only, with the true scope and spirit of the invention being indicated by the following claims.

I claim:

1. A method for simulating bridging faults, wherein a bridge fault occurs at a node having n type transistors grounding the node and p type transistors driving the node to a reference voltage, comprising:

(a) storing strengths of n and p transistor circuits relative to strength of a reference device as a function of voltage level in tables;

(b) determining an equivalent circuit of p devices equivalent to the structure driving a bridge fault to the reference voltage;

(c) determining an equivalent circuit of n devices equivalent to the structure grounding a bridge fault;

(d) using said tables to determine a first ratio of the strength of the equivalent n circuit to the strength of the equivalent p circuit; and (e) determining, based upon said first ratio, how downstream gates interpret said bridge fault.

2. The method for simulating bridge faults of claim 1, wherein step (e) further comprises:

(e.1) retrieving thresholds for at least one gate downstream from said bridge fault from a database;

(e.2) for each such gate, determining a second ratio of relative strengths required to produce such threshold; and (e.3) comparing said first and second ratio, thereby determining the value such gate interprets said bridge fault to be.

3. An Electronic Computer Aided Design (ECAD) system, comprising:

a central processing unit operable to execute executable code;

a random access memory connected to said central processing unit;

a secondary storage device connected to said CPU, containing a circuit design program, in the form of executable code, having a bridge fault simulator for simulating the output value of a bridge fault in a circuit with a voltage source and a ground, wherein a first network of transistors connect the bridge fault with the voltage source and a second network of transistors connect the bridge fault with the ground, wherein the bridge fault drives a plurality of downstream gates, said circuit design program consisting of:

(a) a database of transistor lengths, widths, and input threshold voltage values for a standard cell library;

(b) a plurality of tables, each table uniquely corresponding to a particular number of transistors of a given type, wherein each row in said tables correspond to a voltage and for each voltage each table contains a strength value of a circuit having the specified number of transistors of the given type; and (c) logic operable to:

(c.1) use said database and said tables to determine relative strength of said first network and of said second network;

(c.2) determine a first ratio of said relative strengths;

(c.3) determine a second ratio of relative strengths required to produce the threshold value of each downstream gate; and (e.4) compare the first and second ratios to determine how said down-stream gate interprets the bridge fault;

wherein, said CPU is operable to retrieve and execute said circuit design program from said memory.

4. The ECAD system of claim 3, wherein said first network is composed of n-type devices and said second network is composed of p-type devices, further comprising the step:

determining a first equivalent structure equivalent to said first network and corresponding to one of said tables, and determining a second equivalent structure equivalent to said second network and corresponding to one of said tables.

5. The ECAD system of claim 4, wherein said logic (c) comprises instruction sequences operable to:

retrieve said transistor lengths and widths for the n-type devices and for the p-type devices, and the input threshold values of gates driven by the bridge fault;

look up in said table corresponding to said first equivalent structure a strength value, and interpolate if necessary, to obtain an n-strength;

look up in said table corresponding to said second equivalent structure a strength value, and interpolate if necessary, to obtain a p-strength; and multiply said n-strength and p-strength with the corresponding widths of the n-type and p-type devices, respectively.

6. A bridge fault simulator operable to simulate voltage levels at a bridge faults and to determine how gates downstream from the bridge faults interpret the bridge faults, wherein each bridge fault is a connection between a circuit of p-type devices driving a node to a reference voltage and a circuit of n-type devices ground said node, comprising:

a first memory portion containing lengths, widths, and thresholds for a standard cell library;

a second memory potion containing tables of strengths of combinations of devices relative to unit device strength as a function of voltage level; and a simulation logic, having:
  a first retrieve logic connected to said first memory portion connected to a first data structure having storage locations for transistor lengths and widths of said p-type circuit and said n-type circuit, and input thresholds of gates connected to said bridge fault;
  a second retrieve logic connected to said second memory portion and connected to a second data structure having locations to store strengths for p-type devices driving a bridge fault to a reference voltage and for n-type devices grounding the bridge fault;
  a width multiplier connected to said second data structure;
  a ratio logic connected said second data structure and to a third data structure having a storage location for a ratio; and
  a comparator connected to said threshold storage of said first data structure and to said third data structure, wherein said comparator indicates how said gates connected to said bridge fault interpret said bridge fault.

7. A bridge fault simulator operable to simulate the down-stream effects of a bridge fault, wherein a bridge fault is caused by connecting a node to ground via a first circuit of n-type devices and to a reference voltage via a second circuit of p-type devices, comprising:

a central processing unit (CPU) for executing program instructions;

a database connected to said CPU for storing tables of strengths of combinations of devices relative to unit device strength as a function of voltage;

a memory connected to said central processor and containing a simulation program, having:

strength determination logic connected to said database operable to determine strengths of said first and second devices at a given voltage wherein said determination of strengths includes determination of equivalent circuits corresponding to the combination of devices of said tables;

voltage calculation logic connected to said strength determination logic and operable to use said strengths to calculate a voltage using resistive division;

a control loop connected to said voltage calculation logic and operable to iteratively adjust said strengths such that said calculated voltage converges; and interpretation logic connected to said control loop and operable to accept said converged voltage to determine down-stream interpretation of said voltage.

\* \* \* \* \*